(12) United States Patent
Han

(10) Patent No.: US 8,876,974 B2
(45) Date of Patent: Nov. 4, 2014

(54) CHEMICAL VAPOR DEPOSITION APPARATUS CAPABLE OF CONTROLLING DISCHARGING FLUID FLOW PATH IN REACTION CHAMBER

(75) Inventor: Myung Woo Han, Seoul (KR)

(73) Assignee: LIGADP Co., Ltd., Gyeonggi-do (KR)

( * ) Notice: Subject to any disclaimer, the term of this patent is extended or adjusted under 35 U.S.C. 154(b) by 1061 days.

(21) Appl. No.: 12/843,681

(22) Filed: Jul. 26, 2010

(65) Prior Publication Data

US 2011/0027480 A1 Feb. 3, 2011

(30) Foreign Application Priority Data

Jul. 28, 2009 (KR) .................. 10-2009-0068831

(51) Int. Cl.
*C23C 16/455* (2006.01)

(52) U.S. Cl.
CPC ..... *C23C 16/45565* (2013.01); *C23C 16/45572* (2013.01); *C23C 16/45574* (2013.01)
USPC .......................................................... 118/715

(58) Field of Classification Search
CPC .............. C23C 16/4401; C23C 16/45502; C23C 16/4412; C23C 16/45519; H01J 37/32449
See application file for complete search history.

(56) References Cited

U.S. PATENT DOCUMENTS

| | | | | |
|---|---|---|---|---|
| 5,834,371 A * | 11/1998 | Ameen et al. | ................ | 438/656 |
| 6,176,929 B1 * | 1/2001 | Fukunaga et al. | ............ | 118/715 |
| 6,220,201 B1 * | 4/2001 | Nowak et al. | ............... | 118/723 I |
| 6,974,771 B2 * | 12/2005 | Chen et al. | .................... | 438/637 |
| 7,374,620 B2 * | 5/2008 | Ohmi et al. | ................... | 118/715 |
| 7,378,127 B2 * | 5/2008 | Carpenter et al. | ......... | 427/248.1 |
| 2002/0023588 A1 * | 2/2002 | Yamamuka et al. | ......... | 118/715 |
| 2004/0060513 A1 * | 4/2004 | Kojima et al. | ................ | 118/715 |
| 2005/0059246 A1 * | 3/2005 | Yamada et al. | ............... | 438/689 |
| 2006/0211236 A1 * | 9/2006 | Bureau et al. | ................. | 438/628 |
| 2008/0230518 A1 * | 9/2008 | Brillhart et al. | ................. | 216/58 |

FOREIGN PATENT DOCUMENTS

| | | |
|---|---|---|
| CN | 1848376 A | 10/2006 |
| CN | 101197249 A | 6/2008 |
| CN | 101441982 A | 5/2009 |
| JP | 2005-054252 | 3/2005 |

\* cited by examiner

*Primary Examiner* — Keath Chen
*Assistant Examiner* — Aiden Lee
(74) *Attorney, Agent, or Firm* — William Park & Associates Patent Ltd.

(57) ABSTRACT

A chemical vapor deposition apparatus is equipped to control the width of a gas discharge path between a susceptor and an inner surface of a chamber without having to resort to redesign and remanufacturing of the apparatus. The chemical vapor deposition apparatus includes: a chamber; a susceptor positioned inside the chamber and on which a substrate can be loaded; a shower head injecting a processing gas toward the substrate; and a guide unit detachably installed inside the chamber to guide the processing gas such that the processing gas injected from the shower head is discharged through a chamber hole formed in the chamber.

6 Claims, 7 Drawing Sheets

CHEMICAL VAPOR DEPOSITION APPARATUS CAPABLE OF CONTROLLING DISCHARGING FLUID FLOW PATH IN REACTION CHAMBER

CROSS-REFERENCE TO RELATED PATENT APPLICATION

This application claims the benefit of Korean Patent Application No. 10-2009-0068831, filed on Jul. 28, 2009, in the Korean Intellectual Property Office, the disclosure of which is incorporated herein in its entirety by reference.

BACKGROUND OF THE INVENTION

1. Field of the Invention

The present invention relates generally to a semiconductor manufacturing apparatus for forming a thin layer, and more particularly to a chemical vapor deposition apparatus.

2. Description of the Related Art

Metal organic chemical vapor deposition (MOCVD) is a technique for depositing a thin layer onto a substrate by reacting, for example, a group-III gas and a group-V gas with the substrate in a heated reactor. Using MOCVD, it is possible to build up many thin layers with the ability to precisely control the thickness or chemical composition of each thin layer. As such MOCVD is widely used in semiconductor manufacturing processes.

After forming a thin layer in a processing chamber of a reactor, the residual gas in the processing chamber is discharged out of the processing chamber. When the atmosphere temperature drops below the evaporation temperature of the residual gas being discharged, this could induce formation of undesired particles in the processing chamber. The undesired particles may drop onto the substrate in the processing chamber, and it would create difficulties in acquiring the thin layer having a uniform layer quality or a uniform layer thickness distribution. Also, these undesired particles could attach onto a gas discharge path, causing the warm-keeping effect. This warm-keeping effect refers to the temperature difference created between the preset and the actual temperatures of the processing chamber, and this temperature difference will negatively influence the quality of the thin layer.

Furthermore, when uniform flow distribution of processing gas is not achieved, for example, due to a vortex generated in the gas discharge path, even more undesirable particles may be generated. One reason behind the causes of vortex generation is the improper width of the gas discharge path between the susceptor and the nearby wall of the processing chamber.

In a conventional MOCVD apparatus, the width of the gas discharge path between the susceptor and the wall of the processing chamber is fixed by design such that it would not be possible to control the width of the gas discharging path. Therefore, when the fluid flow distribution of the processing gas in the chamber is not proper, it may become necessary that the apparatus be again designed and manufactured.

SUMMARY OF THE INVENTION

The present invention provides a chemical vapor deposition apparatus having a constitution that can control the width of the gas discharge path between the susceptor and the wall of the processing chamber without again designing and manufacturing the chemical vapor deposition apparatus.

According to an aspect of the present invention, a chemical vapor deposition apparatus includes: a chamber; a susceptor positioned inside the chamber and on which a substrate is loaded; a shower head injecting a processing gas toward the substrate; and a guide unit detachably installed inside the chamber to guide the processing gas such that the processing gas injected from the shower head is discharged through a chamber hole formed in the chamber.

According to another aspect of the present invention, a guide unit is used in a chemical vapor deposition apparatus including a chamber, a susceptor positioned inside the chamber and on which a substrate is loaded, and a shower head injecting a processing gas toward the substrate, and the guide unit is detachably installed inside the chamber to guide the processing gas injected from the shower head to a chamber hole formed in the chamber.

According to another aspect of the present invention, a method for controlling a discharge path of a chemical vapor deposition apparatus including a chamber, a susceptor positioned inside the chamber and on which a substrate is loaded, and a shower head injecting a processing gas toward the substrate, the method includes installing a guide unit guiding the processing gas to a chamber hole formed in the chamber in order to control the width of the discharge path through which the processing gas passes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
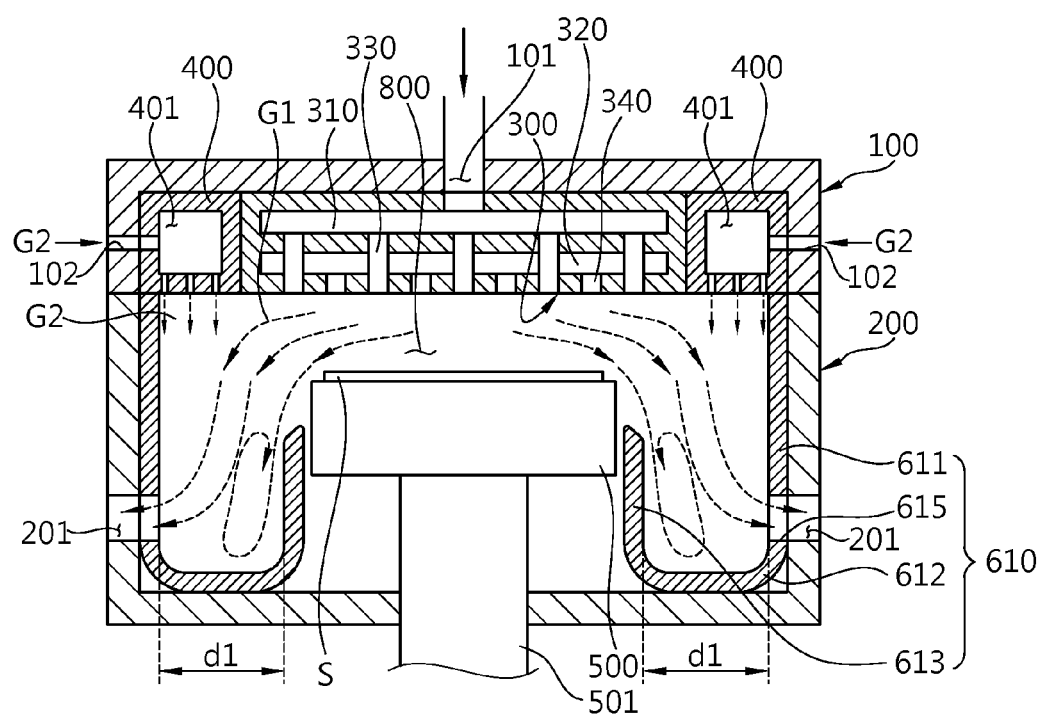
FIG. 1 is a cross-sectional view of a chemical vapor deposition apparatus according to an embodiment of the present invention showing a replaceable guide unit installed inside a chamber.

The present invention will now be described more fully with reference to the accompanying drawings, in which exemplary embodiments of the present invention are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions may be exaggerated for clarity of illustration. Like reference numerals in the drawings denote like elements.

FIG. 1 is a cross-sectional view of a chemical vapor deposition apparatus according to an embodiment of the present invention showing a guide unit 610 (which can be replaced as it will be explained in more detail below with respect to FIGS. 5-7) in place inside a chemical vapor deposition apparatus comprising a first chamber 100 and a second chamber 200. The present embodiment is applicable to other various chemical vapor deposition apparatuses as well as a general MOCVD apparatus.

As shown in FIG. 1, the first chamber 100 and the second chamber 200 are coupled to each other to form a chemical vapor deposition apparatus. The chemical vapor deposition apparatus is supplied with a main processing gas G1 into the second chamber 200, which could be a combination of any predetermined number of processing gases, and FIG. 1 is designed to supply the main processing gas G1 made of two types of processing gases. The first chamber 100 is formed with a first gas inlet 101 to supply a first processing gas and a second gas inlet (not shown in the cross-sectional view of FIG. 1) to supply a second processing gas. The first and second gas inlets may be formed through the upper surface of the first chamber 100 as is the case with the first inlet 101 shown in FIG. 1.

An inert gas inlet 102 may be formed through a side surface of the first chamber 100 to supply an inert gas G2 into the second chamber 200.

A plurality of chamber holes 201 through a side surface of the second chamber 200 as shown in FIG. 1 to exhaust the main processing gas G1 and the inert gas G2 residually remaining after forming a thin layer on the substrate S.

A shower head 300 supplies the main processing gas G1 toward the substrate S for forming a thin layer in the second chamber 200. The main processing gas G1 according to an embodiment of the present invention comprises a first processing gas and a second processing gas, and the product obtained by the reaction between the first and second processing gases is deposited on the substrate S to form a thin layer. The first processing gas could be a gas including a group-III element, and the second processing gas could be a gas including a group-V element according to an embodiment of the present invention.

A first gas distribution space 310 receives the first processing gas introduced through the first gas inlet 101 and distributes it to a plurality of first gas supply pipes 330 into the second chamber 200. A second gas distribution space 320 receives the second processing gas introduced through the second gas inlet (not shown in FIG. 1) and distributes it to a plurality of second gas supply pipes 340 into the second chamber 200. The first and second distribution spaces 310, 320 may be formed inside the shower head 300. The first processing gas supplied through the first gas supply pipe 330 and the second processing gas supplied through the second gas supply pipe 340 are mixed to form the processing gas Gl.

An inert gas injection unit 400 injects the inert gas G2 into the second chamber 200 so as to accelerate the discharge of the processing gas G1. The inert gas injection unit 400 may be formed in a ring or doughnut shape encircling the shower head 300 at its outer circumference nearer to the sidewall of the first chamber 100. The inert gas injection unit 400 has a plurality of penetration holes formed on the lower surface thereof. The inert gas G2 is introduced through the inert gas inlet 102 to an inert gas room 401, and the inert gas G2 may be injected downwardly into the second chamber 200 through the plurality of penetration holes.

The substrate S is loaded on an upper surface of the susceptor 500 so that a thin layer can be formed on the upper surface of the substrate. A heater (not shown) may be provided inside the susceptor 500.

To form a thin layer of uniform thickness, a rotating member 501 capable of rotating the susceptor 500 may be provided below the susceptor 500. In an embodiment of the present invention as shown in FIG. 1, the substrate S and the susceptor 500 rotate as a single body.

A guide unit 610 is placed inside the second chamber 200 to guide the processing gas G1 and the inert gas G2 remaining after the thin layer is formed into the chamber hole 201 through which the residual gases G1, G2 are exhausted out of the second chamber. The portions of the guide unit 610 include a first wall portion 611 formed with a first wall portion hole 615, a curved portion 612, and a second wall portion 613.

As shown in FIG. 1, the first wall portion 611 is nearer to the sidewall of the second chamber 200, and the second wall portion 613 is connected to the first wall portion 611 by the curved portion 612. The second wall portion 613 is spaced apart by a distance d1 from the first wall portion 611. The guide unit 610 may be made of quartz and may resemble a tub shape. The second wall portion 613 is spaced apart by a predetermined distance from the susceptor 500 to avoid the friction that may be caused due to the rotating susceptor 500. However, it is preferable that the distance between the second wall portion 613 and the rotating susceptor 500 be maintained as close to each other as possible so that the residual gas that ought to be exhausted out of the second chamber 200 is not introduced into the gap in between the second wall portion 613 and the susceptor 500.

The first wall portion hole 615 of the first wall portion 611 may be aligned with the chamber hole 201 of the second chamber 200 to allow a continuous path of the residual gas being exhausted.

When the spacing dl between the second wall portion 613 and the first wall portion 611 is very large (see FIG. 1), the residual gas made of the processing gas GI and the inert gas G2 remaining after formation of the thin layer on the substrate S may not be discharged smoothly out of the second chamber 200 due to irregular fluid flow (vortex) formed inside the second chamber 200. Due to this irregular fluid flow, the particles precipitated from the processing gas may excessively attach onto the discharge path, and the particles attached onto the discharge path are one cause of the warm-keeping effect. This will likely lead to the temperature of a reaction space 800 being higher than the preset temperature and will negatively influence the quality of the thin layer being formed.

Figure 2:
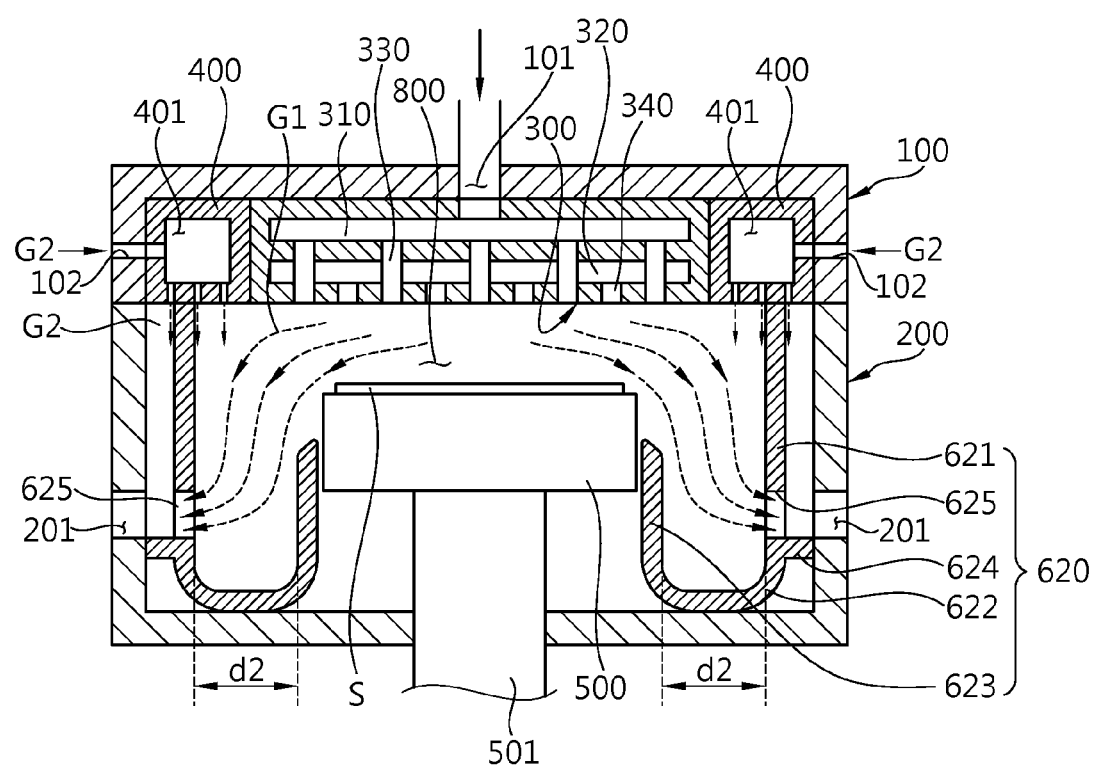
FIG. 2 is a cross-sectional view of a chemical vapor deposition apparatus with a guide unit in place for purposes of eliminating substantially the irregular air flow inside a chamber according to an embodiment of the present invention.

FIG. 2 is a cross-sectional view of a chemical vapor deposition apparatus with a guide unit 620 in place for purposes of eliminating substantially the irregular air flow inside the second chamber 200 according to an embodiment of the present invention.

As shown in FIG. 2, the guide unit 620 is installed such that a second wall portion 623 is spaced apart by a distance d2 (where d1>d2) from a first wall portion 621 and thus an irregular fluid flow is not generated inside a reaction space 800. The first wall portion 621 may be disposed cylindrically so as to form a concentric circle with the susceptor 500.

Whether a vortex is formed inside the second chamber 200 can be confirmed by observing the areas of intense particle accumulation on specific portions of the chemical vapor deposition apparatus, or by performing a computer simulation based on the shape of the reaction space 800 inside the second chamber 200, or by using a sensor detecting fluid flows inside the reaction space 800.

The guide unit 620 guides the main processing gas GI and the inert gas G2 that are remaining after the thin layer is formed into a plurality of first wall portion holes 625. The flowing gases GI and G2 that have passed through the first wall portion holes 625 are then discharged out of the second chamber 200 through a plurality of chamber holes 201 via an extending portion 624.

Figure 3:
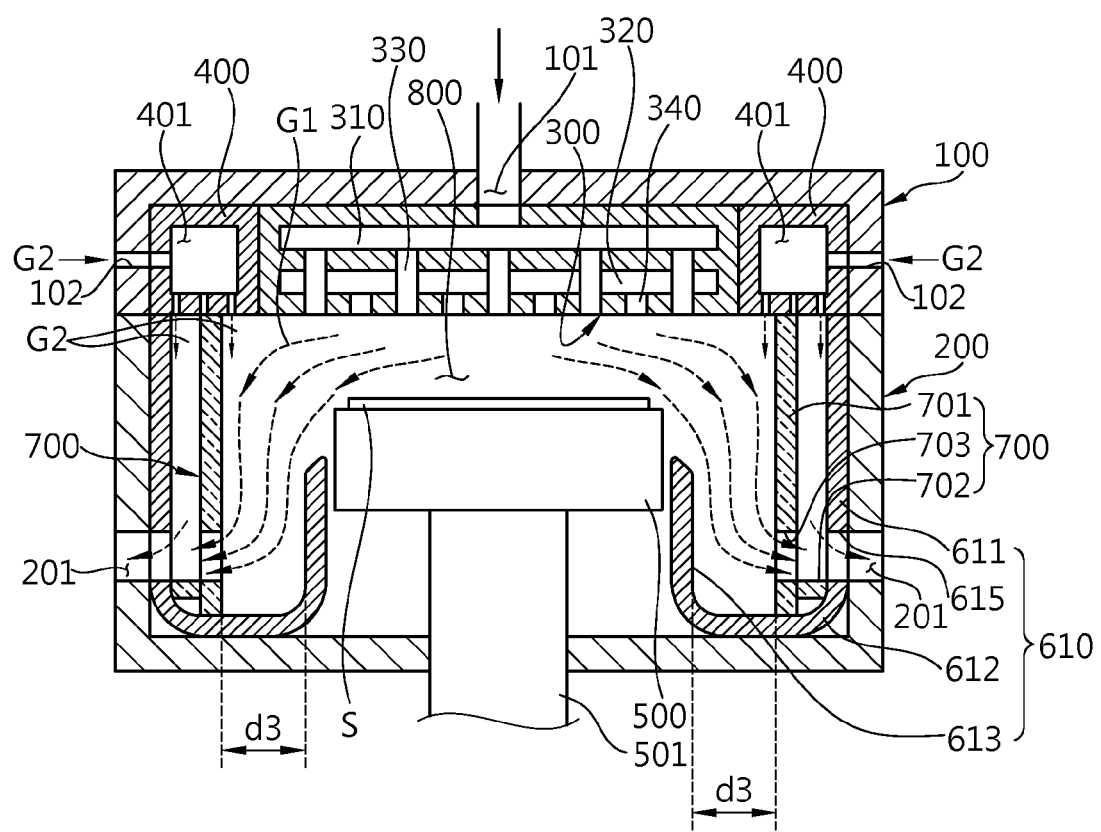
FIG. 3 is a cross-sectional view of a chemical vapor deposition apparatus with a subsidiary plate placed therein for purposes of eliminating substantially the irregular air flow inside a chamber according to an embodiment of the present invention.

FIG. 3 is a cross-sectional view of a chemical vapor deposition apparatus with a subsidiary plate 700 placed therein also for purposes of eliminating substantially the irregular air flow inside the second chamber 200 according to an embodiment of the present invention.

By placing the subsidiary plate 700 inside the second chamber 200, the width of the fluid discharge path (that is, the width between the second wall 613 and the subsidiary plate 700) is further narrowed to d3 (where d1>d2>d3). A subsidiary plate hole 703 is formed through a portion of a subsidiary plate main body 701. The subsidiary plate hole 703 may be formed at a position facing the first wall portion hole 615. A connecting portion 702 connecting the subsidiary plate hole 702 and the first wall portion hole 615 may be provided in the side surface of the subsidiary plate main body 701.

Figure 4:
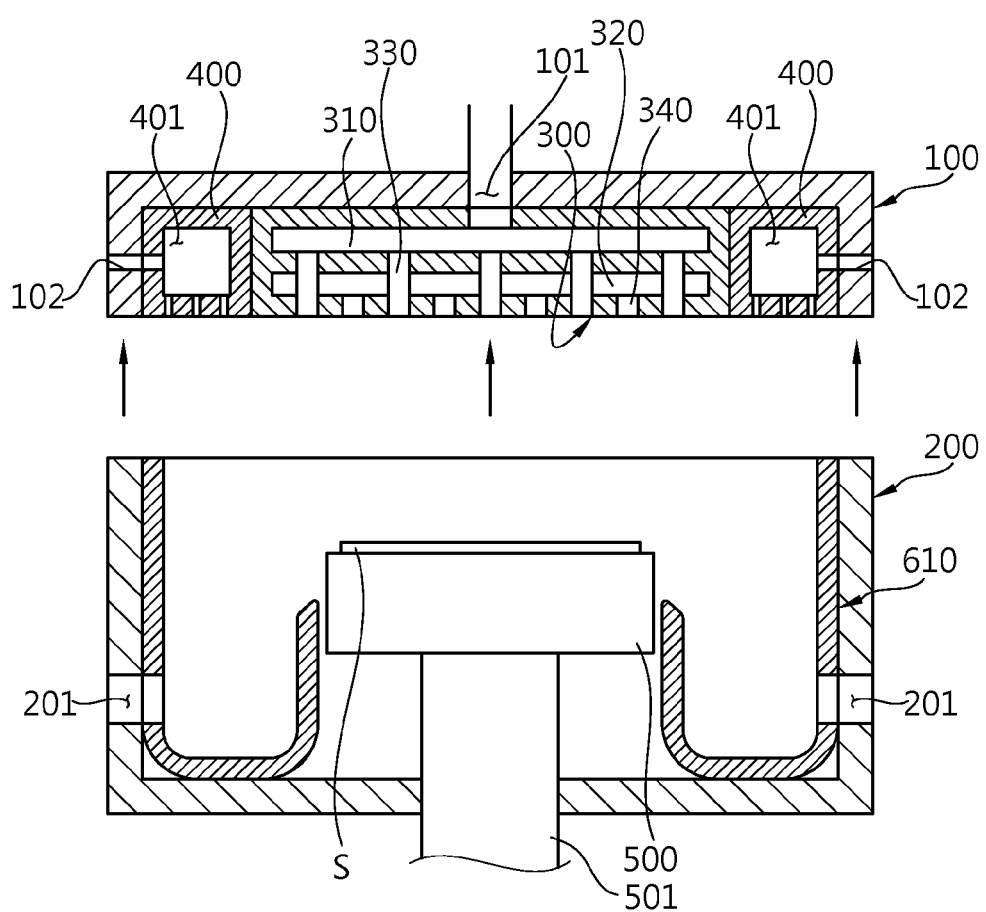
FIGS. 4-5 are cross-sectional views of a chemical vapor deposition apparatus according to an embodiment of the present invention showing opening of a chamber to replace a guide unit therein.
Figure 5:
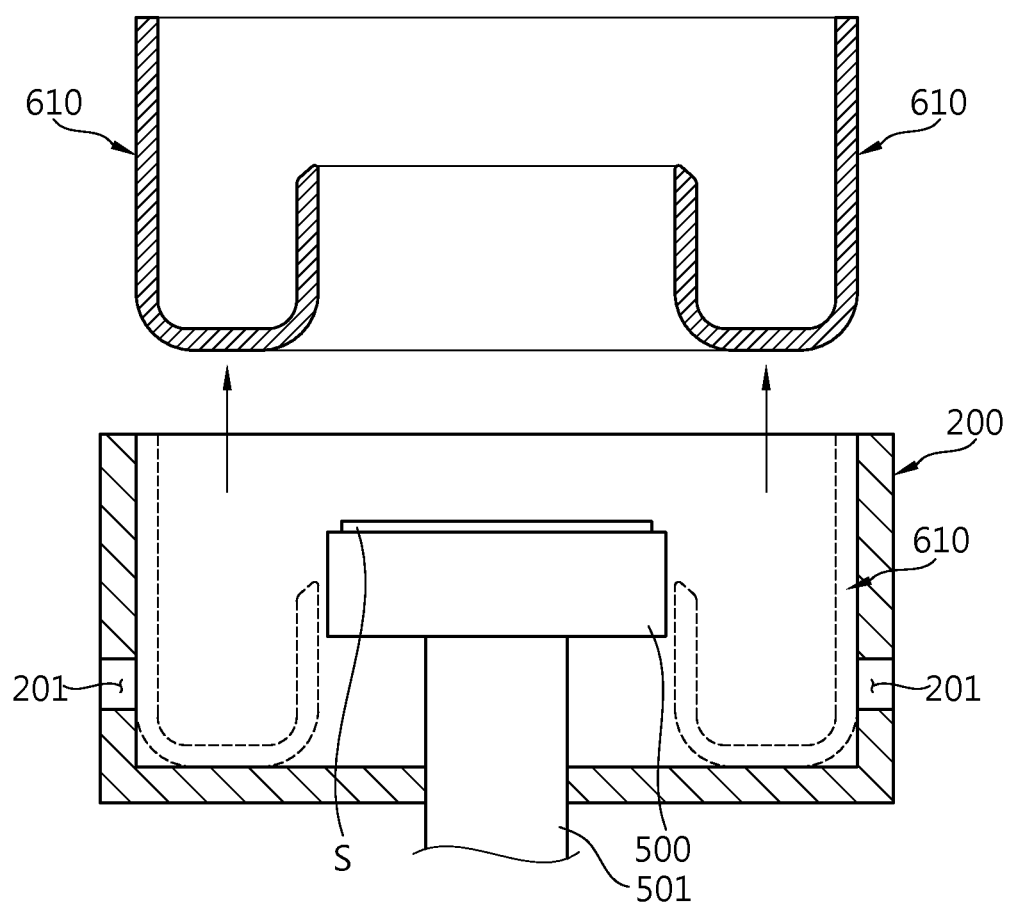

FIG. 4-5 are cross-sectional views of a chemical vapor deposition apparatus according to an embodiment of the present invention showing the first chamber 100 being separated from the second chamber for replacement of guide unit 610.

Now referring to FIGS. 4-5, when an irregular fluid flow is detected inside a reaction space 800, the first chamber 100 may be opened to remove the guide unit 610 from the second chamber 200 manually or by a robot or by other ways of automated procedure for the purposes of replacing the guide unit 610 with other types of guide unit such as 620 shown in FIG. 2 or for the purposes of inserting a subsidiary plate (such as 700 shown in FIG. 3) in order to narrow the width of the discharge path of the residual processing gas being exhausted out of the second chamber.

Figure 6:
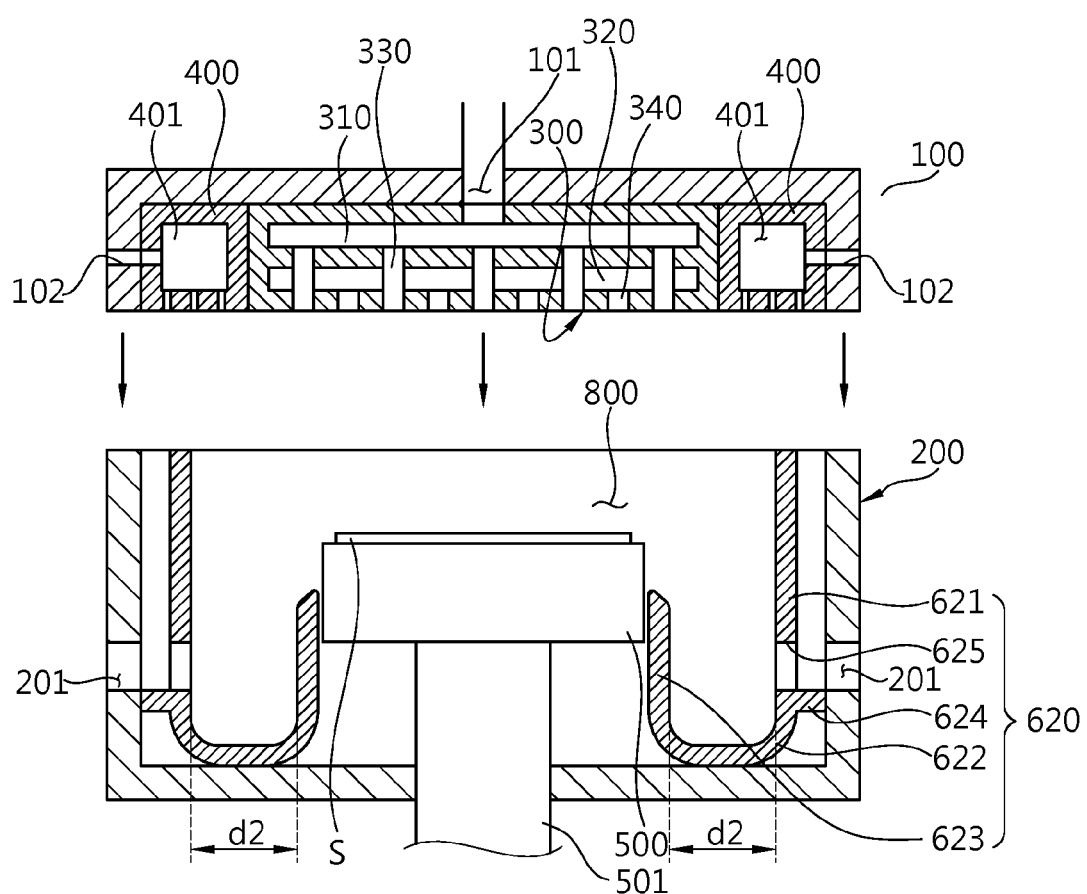
FIG. 6 is cross-sectional view of a chemical vapor deposition apparatus showing a different size guide unit replaced in a chamber according to an embodiment of the invention manually or by a robot or by other ways of automated procedure.

FIG. 6 is cross-sectional view of a chemical vapor deposition apparatus shows a guide unit 620 having a different size than the guide unit 610 shown in FIGS. 4-5 installed in the second reaction chamber 200 manually or by a robot or by other ways of automated procedure.

As shown in FIG. 6, the guide unit 620 having the first wall portion 621 and the second wall portion 623 spaced apart by d2 may be installed in the second chamber 200 between the susceptor 500 and the sidewall of the second chamber 200. The first chamber 100 which has been separated can then is reassembled back together with the second chamber 200.

Figure 7:
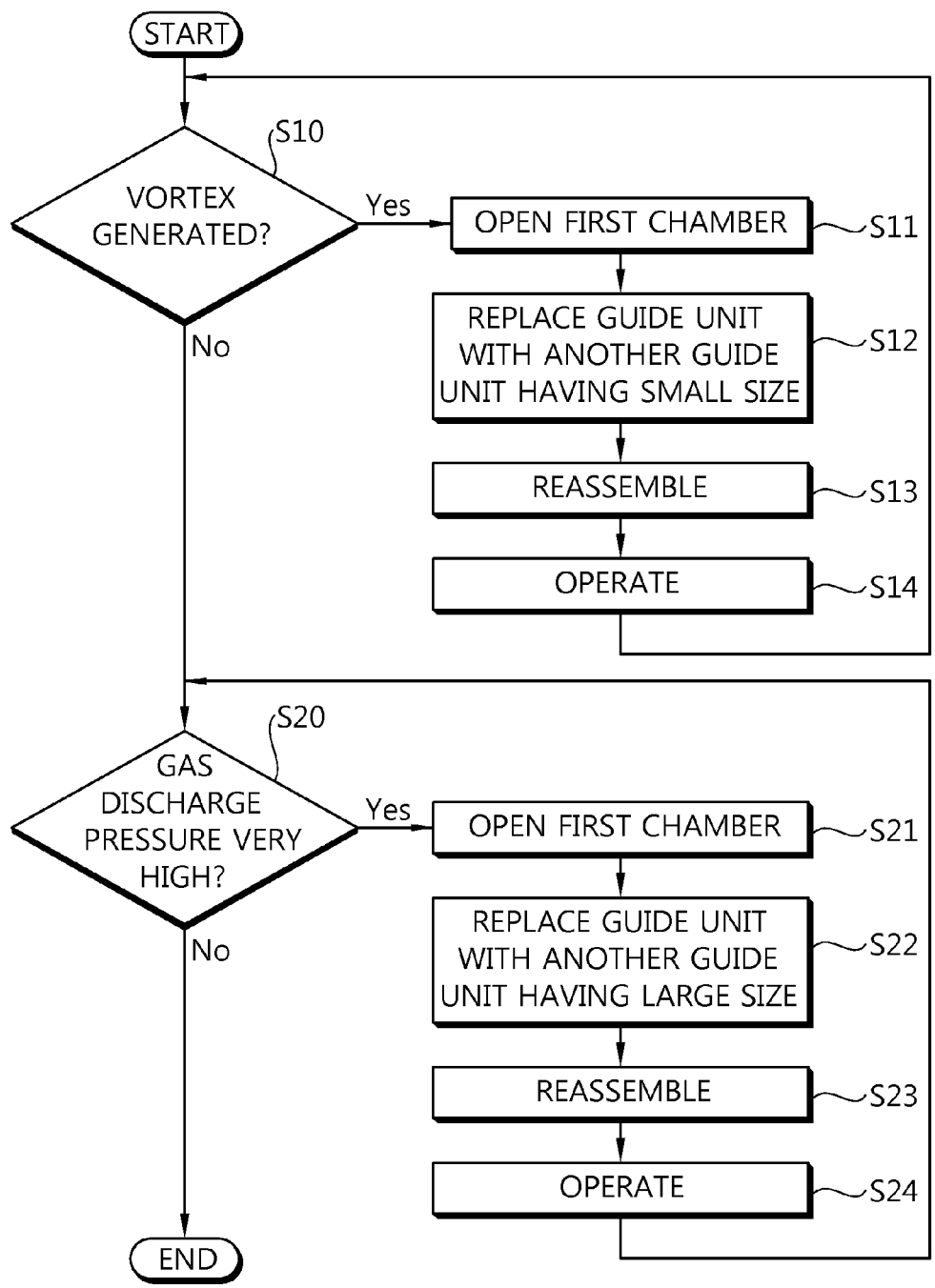
FIG. 7 is a flowchart of a method for controlling the gas discharge path of a chemical vapor deposition apparatus according to an embodiment of the present invention.

FIG. 7 is a flowchart of a method for controlling the gas discharge path of a chemical vapor deposition apparatus according to an embodiment of the present invention.

After operating the chemical vapor deposition apparatus, whether a vortex is formed in the second chamber 200 is checked at step S10 by various methods as described above. For example, whether a vortex is formed inside the second chamber may be confirmed by separating the first and second chambers 100, 200 and observing areas of intense particle accumulation on one or more specific portions of the guide unit, or by performing a computer simulation based on a shape of the reaction space, or by using a sensor detecting fluid flow of the reaction space.

When it is determined that a vortex was generated at step S10, the first chamber 100 is separated from the second chamber 200 at step S11.

Next, the guide unit in the second chamber 200 is replaced with another guide unit of smaller size or narrowed width of the discharge path through which the residual processing gas flows to exit out of the second chamber 200 at step S12. Alternatively, a subsidiary plate may be inserted to realize a width of the discharge path narrower than that provided by the existing guide unit through which the residual processing gas flows to exit out of the second chamber 200 at step S12. The step S12 is performed because it was determined that the width of the processing gas discharge path was large enough to generate a vortex.

At step S13, the first and second chambers are reassembled.

Next, at step S14, the operation of the chemical vapor deposition apparatus is resumed.

Thereafter at step S10, the second chamber 200 is checked again to determine whether a vortex is generated inside the second chamber 200. When a vortex is detected, the steps S11-S14 are repeated. When a vortex is not detected, the pressure of the processing gas being discharged or the discharge rate of the processing gas is checked against a set value at step S20 to determine whether the discharge pressure or the discharge rate is high. The discharge pressure or the discharge rate can be detected by using a pressure sensor or the like.

When it is determined that the discharge pressure or the discharge rate is high compared to the preset value at step S20, the first chamber 100 is separated from the second chamber 200 at step S21.

Next, the guide unit in the second chamber 200 is replaced with with another guide unit of a larger size or wider width of the discharge path through which the residual processing gas flows to exit out of the second chamber 200 at step S22. The step S22 is performed because the high discharge pressure or the high discharge rate compared to the preset value is caused by the width of the discharge path being smaller than the optimal width.

Next, at step S23, the first and second chambers are reassembled, and the operation of the chemical vapor deposition apparatus is resumed at step S24. Thereafter at step S20, the second chamber 200 is checked again to determine whether the discharge pressure or the discharge rate is higher than the set value. When it is determined that the discharge pressure or the discharge rate is high compared to the preset value at step S20, the steps S21-24 are repeated. When it is determined that the discharge pressure or the discharge rate is not very high or sufficiently optimal in comparison to the present value at step S20, it can be determined that the discharge path is properly formed in the second chamber without causing a vortex of fluid flow therein during the operation. Hence, the operation of the chemical vapor deposition apparatus can continue.

Of course, the steps S20-S24 related to detecting whether or not the discharge pressure or the discharge rate is high in comparison to the preset value may be performed prior to the steps S10-S14 of detecting whether or not a vortex is generated.

According to an embodiment of the present invention, even if the discharge path of the residual gas to exit the second chamber 200 is not properly designed, the discharge path can be controlled properly by replacing only the guide unit or inserting an additional part (for example, the subsidiary plate 700 in FIG. 3) for the guide unit without having to redesign and/or reequip the chemical vapor deposition apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, future modifications to the embodiments of the present invention cannot depart from the technical scope of the present invention.

What is claimed is:

1. A chemical vapor deposition apparatus comprising:
a chamber having a gas inlet for introducing a processing gas into the chamber and a gas outlet for exhausting a gas out of the chamber;
a susceptor having a surface capable of loading a substrate thereon positioned inside the chamber, wherein the processing gas is provided toward the surface of the susceptor;
a shower head providing the processing gas toward the surface of the susceptor capable of loading a substrate thereon;
an inert gas injection unit formed in a shape encircling the shower head and injecting an inert gas, and;
a replaceable guide unit detachably installed inside the chamber to guide the gas in the chamber to the gas outlet, and the guide unit comprises:
a first wall portion positioned in the chamber at a distance from a sidewall of the chamber and having first wall portion holes are formed at lower part of the first wall portion to create discharge path to the gas outlet,
a curved portion extending from a lower end of the first wall portion toward the susceptor,
a second wall portion surround the susceptor therein, and
an extending portion extending from the first wall portion to the sidewall of the chamber and forming a path for discharging the gas to the gas outlet by connecting the extending portion to the first portion holes, and
wherein the lower ends of the first and second wall portions of the guide unit are connected by the curved portion, and
wherein the extending portion is formed above the curved portion,
wherein the guide unit is arranged under the inert gas injection unit such that the upper end of the guide unit contacts with a lower surface of the inert gas injecting unit and the lower end of the guide unit contacts with an inner lower surface of the chamber, and therein the inert gas is provided along the front and rear surfaces of the upper end of the guide unit,
wherein the flowing processing gas and inert gas are discharged out of the chamber through the gas outlet via the extending portion formed above the curved portion.

2. The chemical vapor deposition apparatus of claim 1, wherein the guide unit is disposed in the chamber to encircle the susceptor.

3. The chemical vapor deposition apparatus of claim 1, wherein the first wall portion is cylindrical in shape with the susceptor positioned inside the cylindrical first wall portion.

4. The chemical vapor deposition apparatus of claim 1, wherein the first and second wall portions are cylindrical in shape with the diameter of the second wall portion being greater than the diameter of the first wall portion, and wherein the second wall portion is positioned closest to the susceptor without causing a friction therebetween.

5. The chemical vapor deposition apparatus of claim 1, wherein the guide unit is made of quartz.

6. A replaceable guide unit used in a chemical vapor deposition apparatus comprising a chamber, a susceptor having a surface for loading a substrate thereon positioned inside the chamber, a shower head injecting a processing gas toward the surface of the susceptor and an inert gas injection unit formed in a shape encircling the shower head and injecting an inert gas,
wherein the replaceable guide unit is detachably installed inside the chamber to guide the processing gas injected from the shower head to a chamber hole formed in the chamber,
wherein the replaceable guide unit comprises a first wall portion positioned in the chamber at a distance from a sidewall of the chamber and having first wall portion holes are formed at lower part of the first wall portion to create discharge path to the chamber hole formed in the chamber, a curved portion extending from a lower end of the first wall portion toward the susceptor, a second wall portion surround the susceptor therein and an extending portion extending from the first wall portion to the sidewall of the chamber and forming a path for discharging the gas to the chamber hole by connecting the extending portion to the first portion holes, and
wherein the lower ends of the first and second wall portions of the replaceable guide unit are connected by the curved portion, and wherein the extending portion is formed above the curved portion,
wherein the replaceable guide unit is arranged under the inert gas injection unit such that the upper end of the replaceable guide unit contact with a lower surface of the inert gas injecting unit and the lower end of the replaceable guide unit contact with an inner lower surface of the chamber, and therein the inert gas is provided along the front and rear surfaces of the upper end of the replaceable guide unit,
wherein the flowing processing gas and inert gas are discharged out of the chamber through the chamber hole formed in the chamber via the extending portion formed above the curved portion.

* * * * *